Oct. 18, 1960 P. HUHN 2,957,144

VARIABLE FREQUENCY GENERATOR ARRANGEMENT

Filed June 11, 1956 3 Sheets-Sheet 1

INVENTOR:
Peter Huhn
BY:
Michael S. Striker
agt.

INVENTOR:
Peter Huhn
BY:
Michael S. Striker
agt.

INVENTOR.
Peter Huhn
BY:
Michael S. Striker
agt

United States Patent Office 2,957,144

Patented Oct. 18, 1960

2,957,144

VARIABLE FREQUENCY GENERATOR ARRANGEMENT

Peter Huhn, Talerweg 14, Munich 58, Germany

Filed June 11, 1956, Ser. No. 590,728

Claims priority, application Germany June 11, 1955

9 Claims. (Cl. 331—40)

The present invention relates to a frequency generator. More particularly, the present invention relates to a frequency generator which can very accurately generate frequencies throughout a wide frequency range with an accuracy not previously attainable.

There are many methods known of obtaining desired frequencies by means of filtering and adding harmonics of base frequencies, which base frequencies are very accurately controlled. The arrangements for carrying out these conventional methods are constructed usually of one type. This type consists of transforming a single filtered harmonic in decade steps of the base frequency and connecting the same in cascade so that they are added one to the other. The filtering of these harmonics can be carried out in other methods by synchronized oscillators which are synchronized with single harmonics of the frequency spectrum of the base frequency.

Other conventional arrangements are known wherein, instead of frequency additions of the harmonics, simple modulations are provided for producing total frequencies of synchronized oscillators.

Regardless of the type of method carried out by these different conventional apparatus, they are all based on the same principles. These principles include combining a fixed base frequency with a variable frequency to produce combinations of frequencies whereby single harmonics alone can be filtered out or whereby the harmonics can be added to the different steps of the base frequency.

The steps of the base frequencies accordingly correspond to the distance by which the resultant frequencies are positioned from one another. Arrangements are known for example wherein decade step systems are provided.

These decade step systems have a disadvantage since in order to obtain very fine steps between the generated frequencies, it is necessary to provide very low base frequencies. In addition, another disadvantage is the requirement that a different frequency zone with accordingly different switching elements must be provided for each step so that for very small steps of the frequency a large number of different types of single stages are necessary.

It is accordingly an object of the present invention to overcome these disadvantages by using only one base frequency and preferably only one type of frequency multiplier stage for the base frequency.

It is a second object of the present invention to overcome the disadvantages of conventional frequency generators.

Another object of the present invention is to provide a new and improved method and apparatus for providing a wide range frequency generator.

A further object of the present invention is to provide a wide range frequency generator having a plurality of identical stages.

Yet, a further object of the present invention is to provide a frequency generator having a plurality of identical stages and having a very high accuracy.

With the above objects in view the present invention mainly consists of a variable frequency arrangement including standard frequency generating means for providing a plurality of standard frequency impulses, the frequency generating means having an output, a plurality of frequency multipliers, each of the multipliers having a first input connected respectively to the output of the standard frequency generating means and being responsive to the plurality of standard frequency impulses to provide at its respective output a plurality of spaced output frequencies, each of the frequency multipliers having a second input, respectively, a plurality of frequency dividers, each of the frequency dividers having an input connected respectively to the output of one of the frequency multipliers and having an output connected respectively to the second input of another of the frequency multipliers, and a plurality of selector means, each of the selector means being connected respectively to one of the frequency multipliers for selecting a desired output frequency therefrom.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings, in which:

Figure 1:
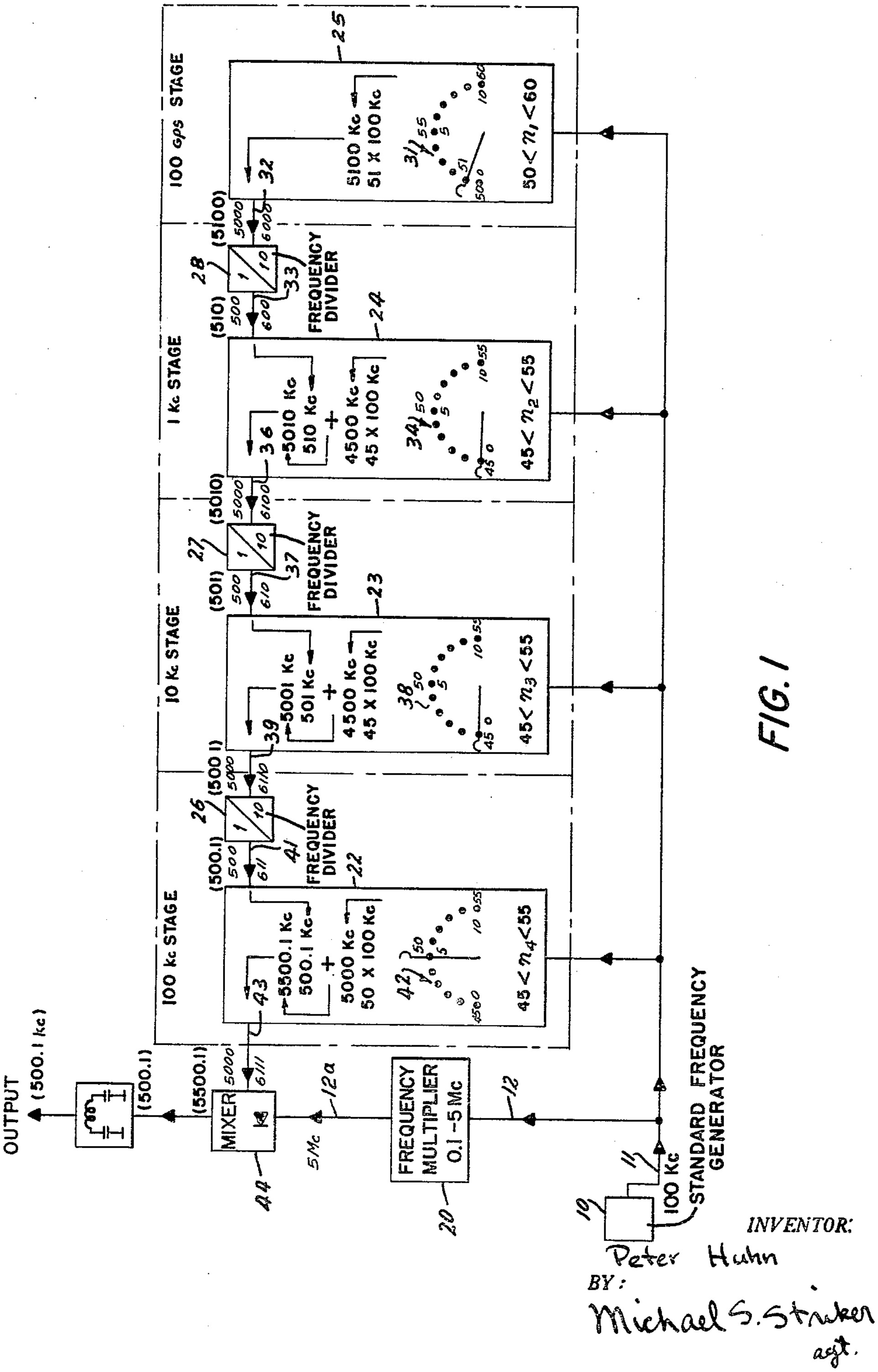
Fig. 1 is a block diagram of a plurality of frequency stages of an apparatus capable of carrying out the principles of the present invention.

Referring now to Fig. 1 it can be seen that a quartz-controlled standard frequency generator 10 emits a fixed frequency of 100 kilocycles which is provided for the base frequency. The 100 kilocycles frequency is emitted from the frequency generator 10 on the conductor 11 in the form of square wave voltage impulses so that a large number of harmonics of the 100 kilocycles frequency are provided in the frequency spectrum output of the standard frequency generator 10.

From the conductor 11 the 100 kilocycles frequency impulses are applied to each of the stages 22, 23, 24 and 25 of the frequency multipliers of the present invention.

In accordance, with the present invention, to be explained more fully hereinbelow, each of the stages 22–25 is constructed substantially identically and responds to an input frequency for multiplying the same to provide a desired output frequency. The frequency stage 25 in the illustrated embodiment is a 100 cycle frequency stage; the frequency stage 24 is a 1 kilocycle frequency stage; the frequency stage 23 is a 10 kilocycles frequency stage, and the frequency stage 22 is a 100 kilocycles frequency stage.

Connected between the stages 22 and 23 is a frequency divider 26 having a 1 to 10 ratio so that the frequency connected to its input is divided by 10 and one tenth of the input frequency is provided at the output thereof. Similar dividers 27 and 28 are provided between the stages 23 and 24 and 24 and 25, respectively.

In accordance with the present invention, the 100 kilocycles voltage impulses are applied to each of the stages 22–25. In the first stage 25, the 100 kilocycles applied to the stage is converted to a frequency range of 5000–6000 kilocycles in a manner to be described hereinbelow. The stage 25 is provided with a selector switch 31 having 10 positions marked 0–10 for setting multiplication factors between 50 and 60, respectively corresponding to 100 cycle steps as will be explained more fully hereinbelow.

The output of the stage 25 is applied on the output conductor 32 to the frequency divider 28 so that at the output conductor 33 of the frequency divider a frequency of 500–600 kilocycles is obtained. That is, the output of the frequency multiplier 25 can be arranged by means of the selector switch 31 so that its output frequency is anywhere from 5000 to 6000 kilocycles. This frequency is divided by 10 in the frequency divider 28 and this divided frequency is applied on the output conductor 33 to the input of the second stage 24.

The stage 24 in the illustrated embodiment is a kilocycle stage and has a selector switch 34. The selector switch has 10 taps thereon marked 0–10 for setting multiplication factors between 45 and 50 which permits the frequency multiplier stage 24 to be set anywhere between the values 4500–5500 kilocycles. That is, the 500–600 kilocycles frequency applied to the input of the stage 24 is mixed with the frequency selected from the frequency spectrum of the 100 kilocycles by the stage 24 to provide an output anywhere in the range from 5000–6100 kilocycles, i.e. 4500+500 to 5500+600, on the output conductor 36.

From the output conductor 36 the output frequency of the stage 24 is applied to the input of the frequency divider 27 which is again a 1 to 10 ratio frequency divider. Accordingly, the frequency appearing on the output lead 37 of the frequency divider 27 is in a range of 500–610 kilocycles corresponding to one tenth of the input frequency thereto.

The frequency in the range 500–610 kilocycles appearing on lead 37 is applied to the input of the stage 23 which is the 10 kilocycles stage. This stage 23 has a 10 position selector switch 38 also marked 0–10 for setting multiplication factors between 45 and 55 and this input frequency is mixed with the spectrum of the 100 kilocycles standard frequency also applied to the stage 23. In this manner, the output of the frequency multiplier stage 23 is in the range of 5000–6110 kilocycles and this output frequency is on the conductor 39.

The output frequency appearing on the conductor 39 is applied to the input of the frequency divider 26 which is a 1 to 10 frequency divider. Accordingly, at the output conductor 41 of the frequency divider 26 is provided a frequency of 500–611 kilocycles. This frequency is applied to the input of the last frequency multiplier stage 22 which is known as the 100 kilocycles stage. The frequency multiplier stage 22 has a 10 position selector switch 42 so that the input frequency in the range 500–611 kilocycles can be mixed with the spectrum of the 100 kilocycles frequency input to provide an output frequency on the output conductor 43 thereof in the range of 5000–6111 kilocycles.

The output frequency 5000–6111 kilocycles is applied to the input of a mixer 44 in which it is mixed with a 5 megacycle output emitted from the frequency multiplier 20 to provide an output frequency anywhere in the range of 0–1.1111 megacycles.

It is therefore seen that with the embodiment illustrated in Fig. 1 it is possible to obtain a frequency anywhere in the range from 0 up to 1.1111 megacycles. For example, in order to obtain an output frequency of 0.5001 megacycle, the selector switch 42 of the frequency stage 22 is set to the position 5. The selector switches 38 and 34 are respectively set to their 0 positions. The selector switch 31 of the stage 25 is set to the position 1. Accordingly, the output of the stage 25 will be 5100 kilocycles. This frequency is divided in frequency divider 28 and the frequency 510 kilocycles appears on the output lead 33 thereof. This frequency is applied to the input of the stage 24 and since the selector switch 34 of this stage has been set at 0 position, the 4500 kilocycles frequency will be selected and the output frequency appearing on the conductor 36 of the output stage 24 will have a frequency of 5010 kilocycles, i.e. 4500+510 kilocycles.

This frequency appearing on the conductor 36 is divided in the frequency divider 27 to a frequency of 501 on the output conductor 37 thereof. This frequency is applied to the input of the stage 23 whose selector switch 38 has also been set at 0. Accordingly, the output of the stage 23 appearing on the conductor 39 will be 4500+501 or 5001 kilocycles.

The frequency of 5001 kilocycles is applied from the conductor 39 to the frequency divider 26 and the output appearing on its output conductor 41 will be this frequency divided by 10 or 500.1 kilocycles.

The frequency of 500.1 kilocycles is applied to the input of the frequency stage 22 whose selector 42 has been set at 5. Accordingly, the output frequency from the stage 22 appearing on the output conductor 43 will be 5000+500.1 kc. or 5.5001 megacycles. This is mixed in the mixer 44 with the frequency 5 megacycles furnished by frequency multiplier 20 which has an input connected by conductor 12 with the standard frequency generator 10, and an output connected by conductor **12*a* with the mixer 44**, so that the latter delivers an output of .5001 megacycle as desired.

Figure 2:
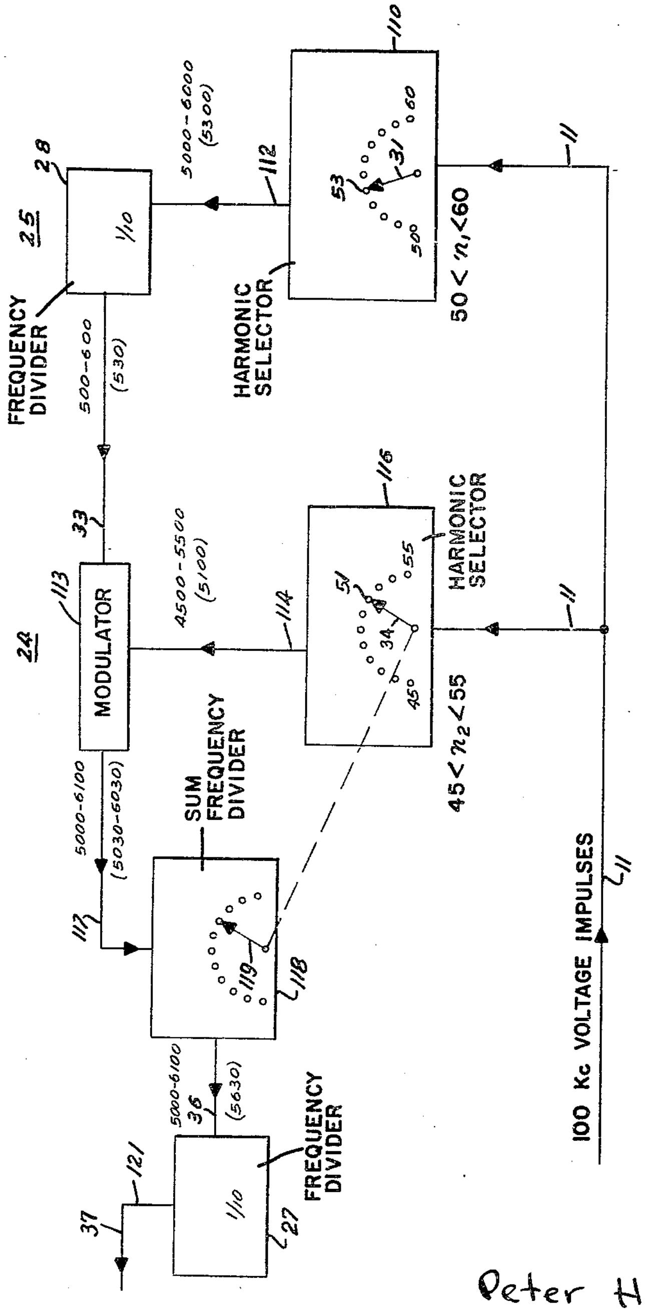
Fig. 2 is a block diagram of two of the stages of the blocks shown in Fig. 1.

Referring now to Fig. 2 a block diagram of two of the stages of Fig. 1 is illustrated. The block diagram of Fig. 2 represents stages 24 and 25. The 100 kilocycles harmonics appearing on the conductor 11 is applied to a filter or set of filters 110 acting as harmonic selector in the stage 25. This filter has a plurality of pass bands and can be set by its selector switch 31 to select a frequency anywhere between the 50th and 60th harmonic of the 100 kilocycles harmonics applied on the input lead 11, in 100 kilocycles steps.

Therefore, appearing on the output conductor 112 of the filter 110 is a frequency between 5000 kilocycles and 6000 kilocycles in 100 kilocycles steps. This frequency on conductor 112 is applied to the input of divider 28 which has a ratio of 1 to 10 so that its output on conductor 33 is in the range 500–600 kilocycles.

The output from divider 28 is applied on conductor 33 to a modulator 113 in stage 24. This modulator 113 also has applied to it, on a conductor 114, the output of harmonic selector filter 116 in stage 24. The output of filter 116 is in the range of 4500 kilocycles to 5500 kilocycles depending on the position of its selector switch 34.

In the modulator 113, the 500–600 kilocycles frequency output of the divider 28 is mixed with the 4500–5500 kilocycles frequency output of the filter 116 also acting as a harmonic selector. Therefore, the modulation outputs from the modulator 113 include frequencies in the range of 5000–6100 kilocycles. These modulation products are applied on conductor 117, in stage 24 to a second filter 118.

Filter 118 in stage 24 has a pass band which is variable in steps by the selector switch 119 which is mechanically coupled to switch 34. Accordingly, the pass band selected by switch 119 is 500–600 kilocycles higher than the harmonic selected by the switch 34. Therefore the total range of filter 118 is 5000 kilocycles to 6100 kilocycles. The output of this filter 118 is applied on output conductor 36 to divider 27 and from there on conductor 121 to the modulator of stage 23 where the cycle is repeated.

Accordingly, with the block diagram of Fig. 2, if it is desired to furnish a frequency of 5876.3 kilocycles for example, the operation proceeds in the following manner: In the 100 cycle stage 25 the selector switch 31 of the harmonic selector 110 is set to 53 so that the output frequency appearing on conductor 112 is 5300. This is divided in the divider 28 connected to the output of harmonic selector 110 by 10 so that the output of the divider provides a frequency of 530. This 530 kilocycles frequency is applied to the next succeeding stage 24 on conductor 33.

The selector switch 34 in stage 24 is set to the 51st harmonic so that a frequency of 5100 is emitted from the harmonic selector 116 on conductor 114. This frequency added in the modulator 113 of stage 24 to the divided frequency 530 kilocycles from the 100 cycle stage 25, provides a sum frequency of 5630 kilocycles in addition to other modulation products. The harmonic selector or filter 116 and the filter 118 are mechanically coupled and switched so that the pass band of the filter 118 is 5600–5700 kilocycles. This is 500–600 kilocycles above the selected harmonic 5100 of the harmonic selector 116. Accordingly, the modulation product 5630 kilocycles is in the pass band of the filter 118 and is applied on conductor 36 to the divider 27 where the 5630 kilocycles frequency is reduced to 563 kilocycles. This 563 kilocycles is applied to the next stage 23 on conductor 121. The harmonic selector 38 (not shown in Fig. 2) in the stage 23 is set to 52 so that its output frequency will be 5200. This will be mixed in its respective modulator, which is equivalent to the modulator 113, with the frequency 563 to provide a plurality of modulation products on the output conductor of the modulator. The filter in stage 23 will have a pass band of 5700–5800 which represents 500–600 kilocycles above the selected harmonic of 5200. Accordingly, the frequency that will be emitted from the filter of stage 23 will be 5763 kilocycles which lies in the pass band thereof.

This 5763 kilocycles frequency is divided by the divider 26 to 576.3 kilocycles and applied to the modulator of the stage 22. Selector switch 42 of stage 22 is adjusted to the 53rd harmonic to have an output frequency of 5300. Accordingly, its filter mechanically coupled thereto will have a pass band of 5800–5900. The 5300 kilocycles frequency from the selector 42 will be applied to its modulator where it is mixed with the 576.3 frequency appearing from the divider 26 of the preceding stage 23. The modulation product that will now lie in the pass band of the filter 117 is 5876.3. Accordingly, the frequency 5876.3 has been provided in accordance with the desired arrangement.

Figure 3:
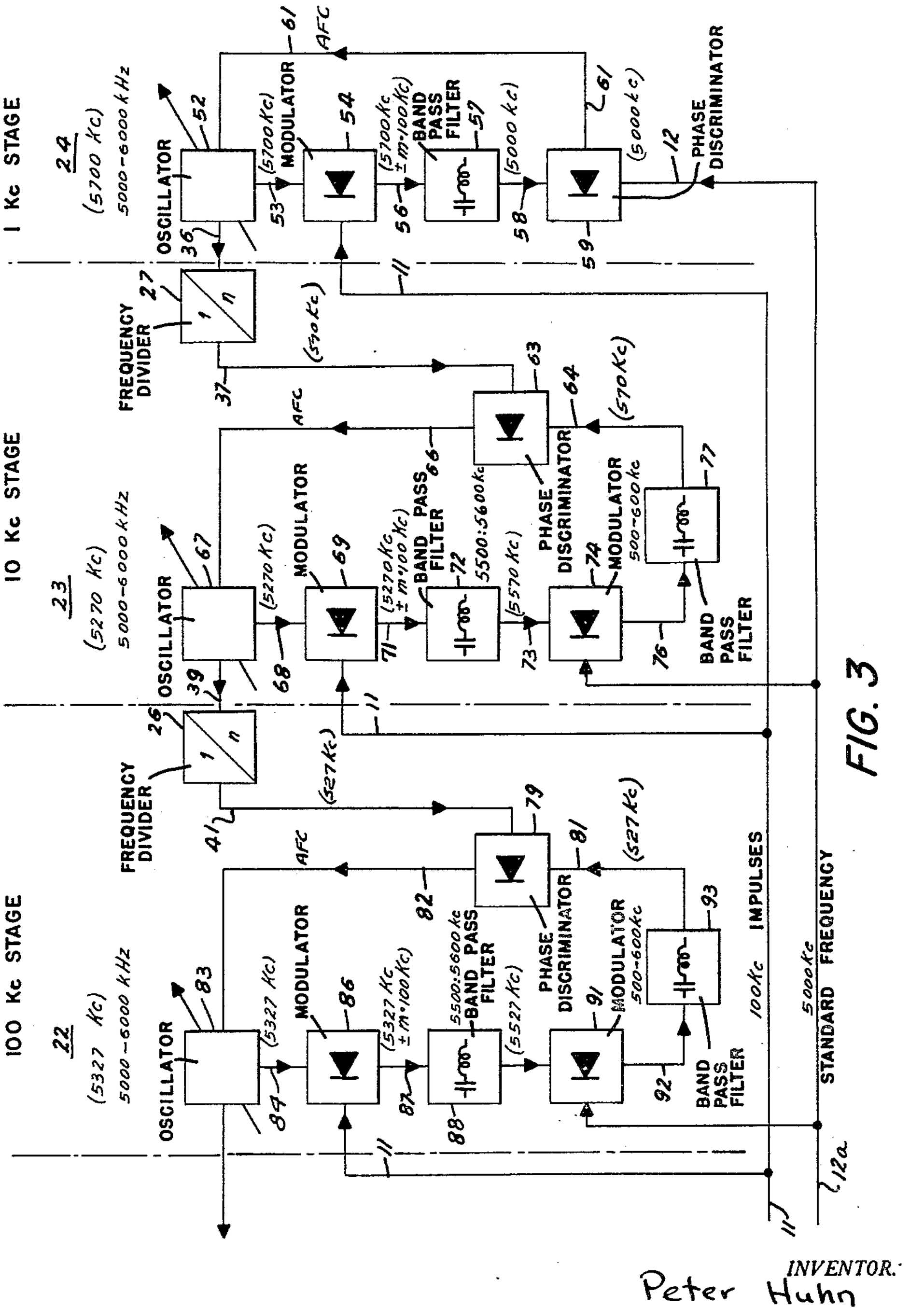
Fig. 3 is a block diagram of another embodiment of the present invention.

Referring now to Fig. 3, the operation of another embodiment will be described. In Fig. 3 only three of the stages are shown in order to avoid unnecessarily complicating the drawing. In order to properly explain the operation of each of the stages, an illustrative example will be traced through the circuit. For this purpose a desired frequency of 5327 kilocycles is chosen. The stage 24 which is the 1 kilocycle stage is accordingly set to 7, the 10 kilocycles stage 23 is set to 2 and the selector switch of the 100 kilocycles stage 22 is set to 3.

The stage 24 includes an oscillator 52 which can be varied in the range from 5000 to 6000 kilocycles by a selector switch which has been set at the position 7, this corresponds to a frequency output from the oscillator 52 on the output conductor 53 of 5700 kilocycles. The 5700 kilocycles output is mixed in the modulator 54 with the spectrum of the 100 kilocycles voltage impulse frequency supplied on the conductor 11 and also applied to the modulator 54.

The output from the modulator 54, taken on the conductor 56 includes a frequency spectrum of 5700 kilocycles$\pm n$ 100 kilocycles. That is, this frequency spectrum includes the frequency 5700 plus or minus a plurality of frequencies in steps of 100 kilocycles. This frequency spectrum is applied to a filter 57 which is tuned to a frequency of 5000 kilocycles. Accordingly, on the output conductor 58 of the filter 57 appears the output frequency 5000 kilocycles which is compared in the phase discriminator 59 with a second standard frequency of 5000 kilocycles. This second standard frequency is obtained from multiplier 20 of Fig. 1 appearing on the conductors 12, **12*a* and is also applied to the phase discriminator 59. From the phase discriminator 59, an automatic frequency control voltage is provided on the output conductor 61. This voltage is applied back to the oscillator 52** to insure the proper operation of the oscillator. That is, if the output of the oscillator varies, the automatic frequency control voltage, being compared to the standard 5000 kilocycles will automatically return the oscillator to the desired 5700 frequency.

Therefore, appearing on the output conductor 36 of the stage 24 will be the 5700 kilocycles frequency of the oscillator 52 which is automatically controlled by the filter circuit and automatic frequency control circuit described hereinabove. This 5700 kilocycles frequency is applied to divider 27 which, as indicated hereinabove, divides the frequency by 10 so that on the output conductor 37 of the frequency divider 27, a frequency of 570 kilocycles appears. This frequency is applied to a phase discriminator 63 where it is mixed with the frequency of 570 kilocycles appearing on the other input to the phase discriminator, conductor 64. This last mentioned 570 kilocycles frequency is derived in a manner which will be described hereinbelow.

The output of the phase discriminator 63 is taken on a conductor 66 and used for automatic frequency control of the oscillator 67 of the stage 23. This oscillator is oscillating at a frequency of 5270. As indicated hereinabove, the oscillator is capable of oscillating in a range of between 5000 and 6000 kilocycles.

Accordingly with the AFC setup and the selector switch of the stage 23 set at the proper value 2, the frequency appearing on the output conductor 68 of the oscillator 67 is 5270 kilocycles. This 5270 kilocycles frequency is applied to a modulator 69 where it is modulated with the 100 kilocycles impulses to produce a spectrum of 100 kilocycles upper and lower side bands.

Therefore, appearing on the output conductor 71 of the modulator 69 is the frequency 5270 plus or minus a plurality of 100 kilocycles side bands. This entire frequency spectrum is applied to a pass band filter 72 which is tuned to a pass band of 5500–5600 kilocycles. It is clear that of the applied frequency spectrum, applied to the input of the filter 72, only the frequency 5570 will lie in the pass band of the filter 72. This corresponds to the third upper side band of the frequency spectrum applied to the input of the filter 72.

Therefore, on the output of the filter 72 appears the frequency 5570 on conductor 73. This frequency is mixed in the mixer or modulator 74 with the 5000 kilocycles standard frequency to provide a plurality of frequency outputs. This plurality of frequency outputs from the mixer 74 appears on the conductor 76 and is applied to the input of a pass band filter 77. The pass band filter has a pass band frequency range of 500–600 kilocycles. Therefore the frequency that will pass through this filter 77 will be 570 kilocycles. This 570 kilocycles frequency is derived by subtracting the 5 megacycles furnished via conductor **12*a*** from 5570 kilocycles.

The output of the filter 77 is taken on the conductor 64 and is applied as explained hereinabove to the input of the phase discriminator 63 where it is compared to the 570 kilocycles output of the frequency divider 27. Accordingly, a proper automatic frequency control for the oscillator 67 is provided.

Therefore, on the output conductor 39 of the stage 23 and oscillator 67 appears the frequency 5270 kilocycles the exact frequency of which is maintained by the automatic frequency control system explained hereinabove. This 5270 kilocycles frequency is applied on conductor 39 to the $\frac{1}{10}$ frequency divider 26 and the output taken on the conductor 41 which is now 527 kilocycles. This 527 kilocycles frequency is applied on the conductor 41 to the input of a phase discriminator 79 where it is compared to a second 527 kilocycles frequency applied to the other input thereof on the conductor 81. The output of the discriminator 79 is taken on the conductor 82 and applied to the oscillator 83 in the stage 22. This oscillator is oscillating with a frequency of 5327 kilocycles. This frequency appears on the output conductor 84 of the oscillator 83 and is applied to a modulator 86 where the 5327 kilocycles frequency is modulated with the 100 kilocycles impulses applied to the input of the modulator on the conductor 11.

Therefore, emerging on the output conductor 87 of the modulator 86 is a frequency spectrum consisting of the frequency 5327 kilocycles plus and minus 100 kilocycles side bands. This frequency spectrum is applied on conductor 87 to the pass band filter 88. The filter 88 has a pass band of 5500–5600 kilocycles. It is therefore clear that the frequency that will pass through the filter 88 will be the frequency 5527 kilocycles, which frequency appears on the output conductor 89 of the filter 88. This frequency 5527 kilocycles corresponds to the second upper side bands of the frequency spectrum emerging from the modulator 86.

The frequency 5527 kilocycles appearing on the conductor 89 is applied to the modulator 91 where it is mixed with the standard 5 megacycles frequency furnished via conductor 12a to obtain a frequency spectrum output on the conductor 92. This frequency spectrum output appearing on conductor 92 is applied to the input of the pass band filter 93. The filter 93 has a pass band of 500–600 kilocycles and it is accordingly seen that the frequency which will pass through this filter is the frequency 527 kilocycles. This 527 kilocycles frequency is obtained by subtracting the 5 megacycles standard frequency from the 5527 kilocycles frequency applied to the input of the mixer 91.

Accordingly, the 527 kilocycles frequency appearing on the output conductor 81 of the filter 93 is applied to the phase discriminator 79 where it is compared to the 527 kilocycles frequency discussed hereinabove.

It is therefore seen that each of the stages of the frequency dividers of the present invention contains an oscillator which is capable of oscillating in various desired 100 kilocycles steps. The output of the oscillator is applied to a modulator where the output frequency is modulated with 100 kilocycles standard pulses to obtain a frequency spectrum consisting of the output frequency of the oscillator plus or minus 100 kilocycles side bands. This frequency spectrum is applied to a filter having a pass band which will permit only one of the side bands to pass therethrough. This side band frequency which emerges from the pass band filter is mixed with the 5 megacycles standard frequency and the output spectrum from this mixer is applied to the input of a second pass band filter having a substantially smaller pass band than the first filter. The output of the second pass band filter is applied to a phase discriminator which also has applied to it the output frequency of the preceding stage and frequency divider. This automatically provides a proper automatic frequency control for the oscillator in this stage.

It is therefore seen that it is possible to lock each of the oscillators in each of the stages at intervals of 100 kilocycles since each time that a side band having a frequency which passes through the first pass band filter is formed, an AFC voltage is produced by the phase sensitive detector. For example, in the stage 22 the output frequency 5327 made use of the second upper side band 5527 which appeared in the pass band of the filter 88. If the oscillator 83 had been set at 5027 kilocycles, this frequency would have used the fifth upper side band to provide the frequency 5527. Similarly, at an output frequency of 5127, the pass band filter would have passed the fourth upper side band of 5527.

If the oscillator 83 oscillated with an output frequency of 5627, the first lower side band would be used to provide a frequency which appeared in the pass band of the filter 88. Therefore, the tuning dial of the oscillator 83 is a selector switch for the particular harmonic designed to appear in the pass band of the filter 88.

The dividers 26, 27 and 28 may be a conventional type, for example of the type shown in Figs. 15.13 and 15.14 on pages 563 and 564 of the book entitled "Wave Forms," Radiation Laboratory Series, vol. 19, edited by Britton Chance et al., published by McGraw-Hill Book Company, 1949.

It should be noted that when the frequency of an oscillator of a preceding stage is varied, the synchronization points of the frequency of the next stage are shifted by an amount that is one-tenth of the amount of the preceding stage. For example, if the frequency of the oscillator 67 in the stage 23 is adjusted by its selector switch to the locking point 5370 kilocycles, then the output frequency of the oscillator 83 in the stage 22 can only be synchronized at frequency values of 5037, . . . 5937 kilocycles. Therefore it can be seen that the addition of the frequency values is accomplished by shifting the comparison frequency of the AFC system which includes the phase discriminators 63 and 79 of Fig. 3.

It can therefore be seen that if the oscillator 67 is shifted by 100 kilocycles, the output frequency of the oscillator 83 has its synchronization points shifted by 10 kilocycles. That is, when the oscillator 67 is oscillating at 5270 kilocycles, the oscillator 83 can be synchronized anywhere from 5027–5927. However, if the oscillator 67 is synchronized at a frequency of 5370, the output frequency of the oscillator 83 can only be synchronized at points corresponding to 5037–5937 kilocycles. It is therefore seen that by changing the output frequency of the oscillator 67 by 100 kilocycles, the synchronization points of the oscillator in the next stage is automatically shifted by 10 kilocycles.

Similarly, when the frequency of the oscillator 52 of the stage 24 is shifted in 100 kilocycles steps, the synchronization points for the oscillator 67 in the stage 23 is also shifted by 10 kilocycles points due to the frequency divider 27. For an output frequency from the oscillator 52 of 5700 kilocycles, the oscillator 67 of the next stage 23 can be synchronized at any frequency between 5070 kilocycles and 5970 kilocycles. If the frequency of the oscillator 52 is varied to 5600 kilocycles, for example, the synchronization frequencies for the oscillator 67 would be 5060–5960.

It is therefore again seen that as the oscillator of a preceding stage is shifted by 100 kilocycles, the oscillator of the next stage has its synchronization points shifted by 10 kilocycle steps.

The oscillator 52 is variable in only 100 kilocycle steps between the frequencies of 5000 and 6000 kilocycles. Since the comparison frequency appearing on the conductor 12 is 5 megacycles and the pass band of the filter 57 is 5 megacycles, only one of the 10 lower 100 kilocycles side bands emerging from the modulator 54 is used. That is, as the frequency of generator 52 is stepped anywhere from 5000 to 6000 kilocycles, it always includes a side band at 5000 kilocycles. For example, if the output frequency of the oscillator 52 were 5900 kilocycles, after mixing in the modulator 54, the frequency that would pass through the filter 57 in the stage 24 would be that frequency of the ninth lower side band or 5000 kilocycles.

It can therefore be seen that each of the oscillators in each of the stages in the same frequency range operate with equal locking intervals. The influence of each of the oscillators on a frequency of the next succeeding stage is reduced because of the dividers connected between the stages to one-tenth of the variation of the frequency in its respective stage.

The correction of the frequency of the oscillators in the various stages by means of the AFC voltages can be done by conventional reactance tubes. For example, one such phase sensitive detector is shown in the above mentioned Radiation Laboratory Series volume on Figs. 14.11 and 14.13 on pages 511 and 512.

It will be understood that each of the elements described above, or two or more together, may also find a useful application in other types of frequency generators differing from the types described above.

While the invention has been illustrated and described as embodied in frequency generator using selected 100 kilocycles harmonics, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be secured by Letters Patent is:

1. In a variable frequency generator arrangement, in combination, standard frequency generating means for providing a plurality of standard frequency impulses, said frequency generating means having an output; a plurality of frequency multipliers, each of said multipliers having a first input connected respectively to said output of said standard frequency generating means and being responsive to said plurality of standard frequency impulses to provide at its respective output a plurality of spaced output frequencies, each but one of said frequency multipliers having a second input, respectively; a plurality of frequency dividers, each of said frequency dividers having an input connected respectively to the output of one of said frequency multipliers and having an output connected respectively to said second input of another of said frequency multipliers; and a plurality of selector means, each of said selector means being connected respectively to one of said frequency multipliers for selecting a desired output frequency therefrom.

2. In a variable frequency generator arrangement, in combination, standard frequency generating means for providing a plurality of standard frequency impulses, said frequency generating means having an output; a plurality of frequency multipliers, each of said multipliers having a first input connected respectively to said output of said standard frequency generating means and being responsive to said plurality of standard frequency impulses to provide at its respective output a plurality of spaced output frequencies in substantially the same frequency range, said output frequencies being respectively spaced from one another an amount equal to the frequency of said standard frequency impulses, each but one of said frequency multipliers having a second input, respectively; a plurality of frequency dividers, each of said frequency dividers having an input connected respectively to the output of one of said frequency multipliers and having an output connected respectively to said second input of another of said frequency multipliers; and a plurality of selector means, each of said selector means being connected respectively to one of said frequency multipliers for selecting a desired output frequency therefrom.

3. In a variable frequency generator arrangement, in combination, standard frequency generating means for providing a plurality of standard frequency impulses, said frequency generating means having an output; a plurality of frequency multipliers, each of said multipliers having a first input connected respectively to said output of said standard frequency generating means and being responsive to said plurality of standard frequency impulses to provide at its respective output a plurality of spaced output frequencies, each but one of said frequency multipliers having a second input, respectively; a plurality of frequency dividers, each of said frequency dividers having an input connected respectively to the output of one of said frequency multipliers and having an output connected respectively to said second input of another of said frequency multipliers, each of said frequency dividers dividing the frequency connected to its input by the same ratio as each of the other frequency dividers; and a plurality of selector means, each of said selector means being connected respectively to one of said frequency multipliers for selecting a desired output frequency therefrom.

4. In a variable frequency generator arrangement, in combination, standard frequency generating means for providing a plurality of standard frequency impulses, said frequency generating means having an output; a plurality of frequency multipliers, each of said multipliers having a first input connected respectively to said output of said standard frequency generating means and being responsive to said plurality of standard frequency impulses to provide at its respective output a plurality of spaced output frequencies in substantially the same frequency range, said output frequencies being respectively spaced from one another an amount equal to the frequency of said standard frequency impulses, each but one of said frequency multipliers having a second input, respectively; a plurality of frequency dividers, each of said frequency dividers having an input connected respectively to the output of one of said frequency multipliers and having an output connected respectively to said second input of another of said frequency multipliers, each of said frequency dividers dividing the frequency connected to its input by the same ratio as each of the other frequency dividers; and a plurality of selector means, each of said selector means being connected respectively to one of said frequency multipliers for selecting a desired output frequency therefrom.

5. A method of generating voltage impulses of a plurality of predetermined frequencies, comprising the first step of generating a plurality of standard frequency voltage impulses having a desired frequency spectrum; the second step of selecting first voltage impulses from said frequency spectrum, said first voltage impulses having a desired first frequency; the third step of dividing the frequency of said selected first voltage impulses by a predetermined ratio; the fourth step of selecting second voltage impulses from said frequency spectrum having a desired second frequency; the fifth step of mixing said selected second voltage impulses with said divided first impulses to produce voltage impulses having a third desired frequency; and repeating said second, third, fourth and fifth steps as desired until the voltage impulses of predetermined frequency are obtained.

6. In a variable frequency generator arrangement, in combination, standard frequency generating means for providing a plurality of first standard frequency impulses, said frequency generating means having an output; a frequency multiplying devices for increasing the frequency of said first standard frequency impulses by a predetermined amount to provide a plurality of second standard frequency impulses; a plurality of frequency multipliers, each of said multipliers having a first input connected respectively to said output of said standard frequency generating means and said frequency multiplying device and being responsive to said plurality of said first and second standard frequency impulses to provide at its respective output a plurality of spaced output frequencies, each but one of said frequency multipliers having a second input, respectively; a plurality of frequency dividers, each of said frequency dividers having an input connected respectively to the output of one of said frequency multipliers and having an output connected respectively to said second input of another of said frequency multipliers; and a plurality of selector means, each of said selector means being connected respectively to one of said frequency multipliers for selecting a desired output frequency therefrom.

7. In a variable frequency generator arrangement, in combination, standard frequency generating means for providing a plurality of standard frequency impulses, said frequency generating means having an output; a plurality of frequency combining means for combining a frequency furnished by said frequency generating means with a variable frequency so as to produce combinations of frequencies, each of said frequency combining means having a first input connected respectively to said output of said standard frequency generating means and being responsive to said plurality of standard frequency impulses so as to provide at its respective output a plurality of spaced output frequencies, each of said frequency combining means having a second input, respectively; a plurality of frequency dividers, each having an input connected respectively to the output of one of said frequency combining means and having an output connected respectively to said second input of another one of said frequency combining means; and a plurality of selective control devices, each being operatively connected, respectively, to one of said frequency combining means for selecting a desired output frequency therefrom.

8. A variable frequency generator arrangement, comprising, in combination, standard frequency generating means for providing a plurality of first standard frequency impulses, said frequency generating means having an output; a frequency multiplying device for increasing the frequency of said first standard frequency impulses by a predetermined amount to provide at least one sequence of second standard frequency impulses; a plurality of frequency multipliers, each of said multipliers having a first input connected respectively to said output of said standard frequency generating means and being responsive to said plurality of standard frequency impulses to provide at its respective output a plurality of spaced output frequencies, each but one of said frequency multipliers having a second input, respectively; mixing means connected to said frequency multiplying device for mixing said second standard frequency with an output frequency of at least one of said frequency multipliers; a plurality of frequency dividers, each of said frequency dividers having an input connected respectively to the output of one of said frequency multipliers and having an output connected, respectively, to said second input of another one of said frequency multipliers; and a plurality of selector means, each of said selector means being connected respectively to one of said frequency multipliers for selecting a desired output frequency therefrom.

9. A variable frequency generator, comprising, in combination, a standard frequency generator delivering a band of adjacent harmonics of a fixed standard frequency and having an output; a plurality of frequency combining stages, all having a first input connected to said output of the standard frequency generator and having a device for selecting a desired single harmonic out of said band of harmonics of the fixed standard frequency, all but one of said frequency combining stages having a second input for a variable frequency and each having an output delivering the algebraic sum of the selected standard frequency harmonic and said variable frequency; a plurality of frequency dividers, each having an input connected to the output of one of said frequency combining stages and an output connected to the second input of the frequency combining stage next higher in order.

References Cited in the file of this patent

UNITED STATES PATENTS

| | | |
|---|---|---|
| 2,354,800 | Deal | Aug. 1, 1944 |
| 2,380,868 | Peterson | July 31, 1945 |